US008581311B1

(12) United States Patent
He

(10) Patent No.: US 8,581,311 B1
(45) Date of Patent: Nov. 12, 2013

(54) SEMICONDUCTOR DEVICE

(71) Applicant: Semiconductor Manufacturing International (Beijing) Corporation, Beijing (CN)

(72) Inventor: Youfeng He, Shanghai (CN)

(73) Assignee: Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 13/961,907

(22) Filed: Aug. 8, 2013

Related U.S. Application Data

(62) Division of application No. 13/306,834, filed on Nov. 29, 2011, now Pat. No. 7,536,001.

(30) Foreign Application Priority Data

Dec. 1, 2010 (CN) .......................... 2010 1 0569390

(51) Int. Cl.
*H01L 21/336* (2006.01)
(52) U.S. Cl.
USPC ........... 257/288; 257/327; 257/329; 257/368; 257/E29.255

(58) Field of Classification Search
USPC .............. 257/288, 192, 327–329, 341; 438/197–199, 230, 299, 478, 607, 429
See application file for complete search history.

(56) References Cited

U.S. PATENT DOCUMENTS

| 7,407,860 B2 | 8/2008 | Kim et al. |
| 7,985,641 B2 | 7/2011 | Kim et al. |
| 8,138,053 B2 | 3/2012 | Utomo et al. |
| 8,344,447 B2 * | 1/2013 | Lin et al. ........................ 257/327 |
| 2008/0048217 A1 | 2/2008 | Kim et al. |
| 2009/0189203 A1 | 7/2009 | Matsuo |
| 2011/0306170 A1 * | 12/2011 | Wang et al. ................... 438/197 |
| 2012/0223364 A1 | 9/2012 | Chung et al. |

* cited by examiner

*Primary Examiner* — Dung A. Le
(74) *Attorney, Agent, or Firm* — Anova Law Group, PLLC

(57) ABSTRACT

A semiconductor device and a method for forming the same are provided. The method includes: providing a substrate having a gate structure and first spacers on both sidewalls of the gate structure formed on a top surface of the substrate; forming first openings in the substrate by using the first spacers as a mask, wherein the first openings are located on both sides of the gate structure; forming second openings by etching the first openings with an etching gas, wherein each of the second openings is an expansion of a corresponding one of the first openings toward the gate structure and extends to underneath an adjacent first spacer; and forming epitaxial layers in the first openings and the second openings.

8 Claims, 3 Drawing Sheets

SEMICONDUCTOR DEVICE

CROSS REFERENCE TO RELATED APPLICATIONS

This application is a divisional of U.S. patent application Ser. No. 13/306,834, filed on Nov. 29, 2011, which claims priority to Chinese Patent Application No. 201010569390.6, filed on Dec. 1, 2010, all of which are incorporated herein by reference in their entirety.

FIELD OF THE INVENTION

The present invention generally relates to the semiconductor manufacturing field, and more particularly, to a semiconductor device and a method for forming the semiconductor device.

BACKGROUND OF THE INVENTION

It is well known that carrier mobility and energy gap of silicon can be changed by a mechanical stress. And, recently, the mechanical stress plays a more and more important role in influencing performance of MOSFETs. If the carrier (electrons in NMOS transistors or holes in PMOS transistors) mobility can be increased by appropriate control of the mechanical stress, the drive current can be increased. In other words, the performance of MOSFETs can be improved greatly by the mechanical stress.

Specifically, the stress liner technology is adopted to form tensile stress liners in NMOS transistors and to form compressive stress liners in PMOS transistors, which can increase the drive currents of the NMOS transistors and the PMOS transistors and increase the response speed of an integrated circuit. According to a study, the dual stress liner technology can increase the response speed of the integrated circuit by 24%.

For example, in a PMOS transistor, firstly epitaxial layers, such as SiGe epitaxial layers, are formed in the regions where source/drain regions will be formed, and then the source/drain regions are formed by doping. By forming the SiGe epitaxial layers, a compressive stress is formed because of lattice mismatch between Si and Ge, which further improves the performance of the PMOS transistor.

A method for forming a PMOS transistor with SiGe epitaxial layers formed in source/drain regions is disclosed in a prior art. The method includes: forming a gate structure on a top surface of a substrate; forming spacers on both sidewalls of the gate structure; forming openings in the substrate on both sides of the gate structure by using the spacers as a mask; forming SiGe epitaxial layers with an epitaxial forming process in the openings; and forming source/drain regions by doping the SiGe epitaxial layers.

However, in the semiconductor manufacturing process, PMOS transistors and NMOS transistors are generally formed on a same substrate. Specifically, firstly a substrate is provided, which includes PMOS gate structures and NMOS gate structures formed thereon. Afterward, spacers are formed on both sidewalls of each gate structure. The spacers round the PMOS gate structures will be used as a mask to form epitaxial layers, and the spacers round the NMOS gate structures will be used to protect the NMOS gate structures from being exposed in an environment for forming the epitaxial layers.

In the prior art, while forming the epitaxial layers, distances between two adjacent epitaxial layers can be reduced by reducing the width of the spacers, so that compressive stresses between the epitaxial layers and channel regions are increased. However, the reduction of the width of the spacers located on both sidewalls of the NMOS gate structures may impair the protective effect for the NMOS gate structures, or even cause the NMOS gate structures to be exposed in the environment for forming the epitaxial layers, which may reduce the reliability of NMOS transistors. Similarly, the problems mentioned above may exist in a process for forming epitaxial layers on both sides of the NMOS gate structure in the prior art.

SUMMARY OF THE INVENTION

Embodiments of the present invention provide a semiconductor device and a method for forming the semiconductor device, in order to increase stresses between epitaxial layers and channel regions and to improve the performance of transistors.

Embodiments of the present invention provide a method for forming a semiconductor device. In an embodiment, the method includes:

providing a substrate having a gate structure and first spacers on both sidewalls of the gate structure formed on a top surface of the substrate;

forming first openings in the substrate by using the first spacers as a mask, wherein the first openings are located on both sides of the gate structure;

forming second openings by etching the first openings with an etching gas, wherein each of the second openings is an expansion of a corresponding one of the first openings toward the gate structure and extends to underneath an adjacent first spacer; and forming epitaxial layers in the first openings and the second openings.

Optionally, an included angle between a side wall of the second opening and the top surface of the substrate ranges from about 63° to about 90°.

Optionally, while forming the first openings, the second openings and the epitaxial layers, a sacrificial spacer covers the gate structure.

Optionally, the method for forming a semiconductor device further including: removing the first spacers; and forming offset spacers on both sidewalls of the gate structure after the first spacers are removed.

Optionally, each of the second openings extends to underneath the adjacent offset spacer.

Optionally, each of the first spacers includes an offset spacer and a protective layer outside the offset spacer, the offset spacers and the protective layers are formed in a same step, and the protective layers are removed after the epitaxial layers are formed in the first openings and the second openings.

Optionally, each of the first spacers includes an offset spacer and an outer spacer which is located outside of the offset spacer, and the sacrificial spacer and the outer spacers are formed in a same step.

Optionally, each of the second openings extends to underneath an adjacent outer spacer.

Optionally, the first openings are formed by a plasma etching process.

Optionally, the second openings and the epitaxial layers in the first opening and the second opening are formed by a same equipment.

Optionally, the equipment includes a reduced-pressure chemical vapor deposition epitaxy.

Optionally, the second openings are formed by an anisotropic etching process.

Optionally, an etching gas used in the anisotropic etching process includes hydrogen chloride or a mixture of chlorine and hydrogen.

Optionally, wherein the etching gas used in the anisotropic etching process includes a mixture of chlorine and hydrogen, and etching parameters for forming the second openings include: a flow rate of chlorine ranging from about 50 sccm to about 300 sccm, a flow rate of hydrogen ranging from about 5 sccm to about 50 sccm, a pressure intensity of a chamber ranging from about 1 torr to about 760 torr and an etching temperature ranging from about 550° C. to about 850° C.

Optionally, the etching gas used in the anisotropic etching process includes hydrogen bromide, and etching parameters for forming the second spacers include: a flow rate of hydrogen bromide ranging from about 50 sccm to about 300 sccm, a pressure intensity of a chamber ranging from about 10 torr to about 760 torr, and an etching temperature ranging from about 550° C. to 850° C.

Optionally, a width of each first spacer ranges from about 15 nm to about 20 nm.

Optionally, a width of each second opening ranges from about 1 nm to about 20 nm.

Optionally, the method for forming a semiconductor device further including: after the second openings are formed, performing an annealing process to the first openings and the second openings.

Optionally, the annealing process and the epitaxial forming process are performed in the reduced-pressure chemical vapor deposition epitaxy.

Optionally, process parameters in the annealing process include: a flow rate of hydrogen ranging from about 20 sccm to about 50 sccm, an annealing time period ranging from about 60 s to about 120 s, an annealing temperature ranging from about 800° C. to about 850° C., and a pressure intensity of the chamber ranging from about 1 torr to about 700 torr.

The embodiments of the present invention also provide a semiconductor device. In an embodiment, the semiconductor device includes:

a substrate;
a gate structure formed on a top surface of the substrate;
first spacers formed on both sidewalls of the gate structure;
first openings formed in the substrate and on the both sides of the gate structure;
second openings formed in the substrate and under the first spacers, wherein each of the second openings is an expansion of a corresponding one of the first openings toward the gate structure; and
epitaxial layers formed by filling up the first openings and the second openings.

Optionally, a side wall and an included angle between the side wall of the second opening and the top surface of the substrate ranges from about 63° to about 90°.

Optionally, each of the first spacers includes an offset spacer.

Optionally, each of the second openings extends to underneath an adjacent offset spacer.

Optionally, each of the first spacers includes an outer spacer.

Optionally, each of the second openings extends to underneath an adjacent outer spacer.

Optionally, a width of each first spacer ranges from about 15 nm to about 20 nm.

Optionally, a width of each second opening ranges from about 1 nm to about 20 nm.

Compared with the prior art, the embodiments of the present invention has the following advantages.

The second openings are formed by etching side walls of the first openings with the etching gas. The second openings are coupled with the first openings and located in the substrate under the first spacers, which can increases the stresses between the epitaxial layers and the channel regions, so that the performance of transistors can be enhanced. Specifically, if the transistor is a PMOS transistor, compressive stresses between the epitaxial layers and the channel regions can be increased, and if the transistor is an NMOS transistor, tensile stresses between the epitaxial layers and the channel regions can be increased.

Moreover, each of the second openings includes a side wall and an included angle between the side wall and a top surface of the substrate ranging from about 63° to about 90°. Preferably, the included angle between the side wall and the top surface of the substrate is less than 90°. And the epitaxial layers are formed by filling the first openings and the second openings. With scaling down of the dimension of semiconductor devices, the epitaxial layers formed are closer to the channel regions so that the stresses between the epitaxial layers and the channel regions can be enhanced more greatly, which can increase the migration rate of carriers, thereby promoting the response speed of semiconductor devices.

Furthermore, in the embodiments of present invention, the second openings are formed by etching the side walls of the first openings, so that the width of the spacers is not reduced, which may not affect the protective effect of the spacers on the devices which need to be protected by the spacers.

DETAILED DESCRIPTION OF THE EMBODIMENTS

In the prior art, while forming epitaxial layers on MOS transistors, distances between two adjacent epitaxial layers can be reduced by reducing widths of spacers, so that stresses between the epitaxial layers and the channel regions of the MOS transistors are increased. However, the reduction of the widths of the spacers of some MOS transistors on which no epitaxial layers are formed may impair the protective effect for the gate structures, or even cause the gate structures to be exposed in an environment for forming the epitaxial layers, which may reduce reliability of a semiconductor device.

To solve the problems mentioned above, an embodiment of the present invention provides a method for forming a semiconductor device, including: providing a substrate, wherein a gate structure and first spacers on both sidewalls of the gate structure are formed on the substrate; forming first openings in the substrate by using the first spacers as a mask, wherein the first openings are located on both sides of the gate structure; forming second openings by etching the first openings with an etching gas, wherein each of the second openings is an expansion of a corresponding one of the first openings and extends to underneath an adjacent first spacer; and forming epitaxial layers in the first openings and the second openings.

Figure 1:
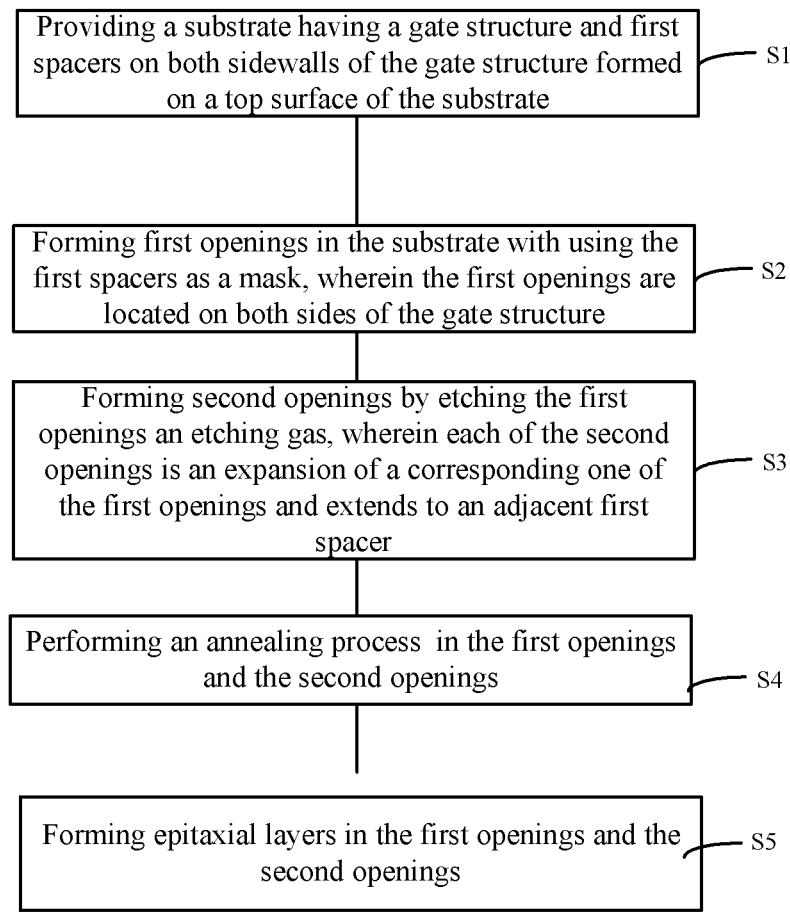
FIG. 1 is a flow chart of a method for forming a semiconductor device in an embodiment of the present invention.

FIG. 1 is a flow chat of a method for forming a semiconductor device in an embodiment of the present invention. Referring to FIG. 1, the method includes the following steps:

S1, providing a substrate having a gate structure and first spacers on both sidewalls of the gate structure formed on the substrate;

S2, forming first openings in the substrate by using the first spacers as masks, wherein the first openings are located on both sides of the gate structure;

S3, forming second openings by delivering an etching gas into the first openings, wherein each of the second openings is an expansion of a corresponding one of the first openings and extends to an adjacent first spacer;

S4, performing an annealing process to the first openings and the second openings; and S5, forming epitaxial layers in the first openings and the second openings.

In order to clarify the objects, characteristics and advantages of the invention, embodiments of the present invention will be described hereinafter in conjunction with attached drawings. In the embodiments, the epitaxial layers may include a material selected from SiGe, boron doped SiGe, silicon carbon, and phosphorus doped silicon carbon. The following description will employ the epitaxial layers including SiGe.

Figure 2:
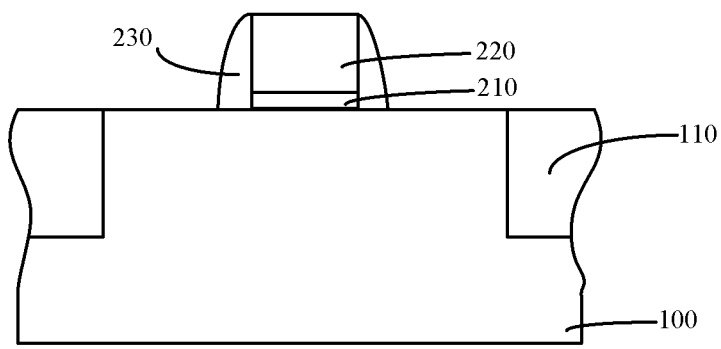
FIG. 2 to FIG. 5 are schematic cross-sectional views of intermediate structures illustrating a method for forming a semiconductor device in an embodiment of the present invention.

Referring to FIG. 2, in an embodiment, a substrate 100, which has isolation regions 110 formed therein, is provided. In an example embodiment, the substrate 100 has a side wall including a crystal plane (110) and a top surface including a crystal plane (100). The substrate 100 has a gate structure formed thereon, and the gate structure includes a gate dielectric layer 210 and a gate 220 located on the gate dielectric layer 210.

In an embodiment, the substrate 100 may include silicon, the isolation regions 110 may be a silicon oxide shallow trench isolation structure, the gate dielectric layer 210 may include silicon oxide, silicon nitride or high-k materials, and the gate 220 may include doped poly silicon, metal, metal silicide or other conductive materials. In an example embodiment, epitaxial layers are formed on source/drain regions of a PMOS transistor and the substrate 100 is an N type substrate.

Referring to FIG. 2, first spacers 230 are formed on both sidewalls of the gate structure. By using the first spacers 230 as masks, two parts of the substrate located on both sides of the gate structure can be etched to form first openings.

Moreover, spacers are also formed in regions where NMOS transistors are formed or regions where no epitaxial layer is formed (not shown in drawing) to protect gate structures of NMOS transistors from being damaged in an environment where the epitaxial layers are formed.

In an embodiment, the first spacers 230 may include silicon oxide, silicon nitride or a mixture of silicon oxide and silicon nitride, and a width of each first spacer 230 ranges from about 15 nm to about 20 nm. In an example embodiment, the width of each first spacer 230 is about 20 nm, which is wide enough for protecting the gate structures of NMOS transistors. In other embodiments, the width of each spacer 230 can be configured depending on practical process requirements.

Figure 3:
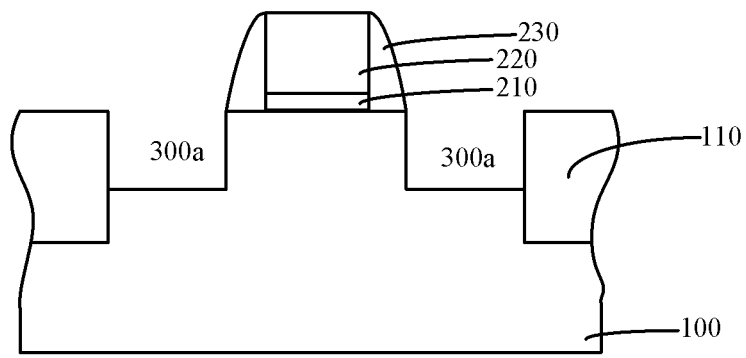

Referring to FIG. 3, first openings 300a are formed by etching the two parts of the substrate 100 located on both sides of the gate structure by using first spacers 230 as a mask. In an embodiment, the first openings 300a are formed by a plasma dry etching process.

Specifically, the plasma dry etching process is performed by injecting high energy plasma in a direction which is perpendicular to the top surface of the substrate 100. And a cross-sectional shape of each first opening 300a is a rectangle. In addition, a part of the substrate 100 which is under the first spacers 230 is not etched or only a little of the part of substrate 100 is etched.

Furthermore, in order to remove particles and organic materials in the first openings 300a, the structure formed after the plasma dry etching process is cleaned in an acid tank before forming the epitaxial layers.

Figure 4:
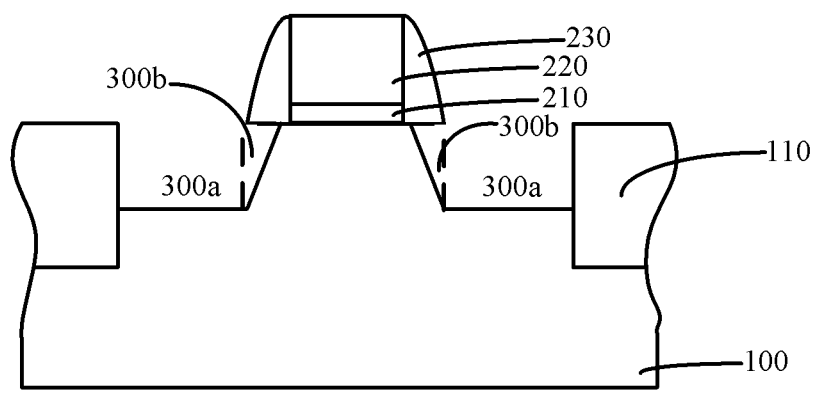

Referring to FIG. 4, an anisotropic etching process is performed to the substrate 100 to form second openings 300b. The second openings 300b are underneath the first spacers 230 and expansions of the first openings 300a. Sizes and locations of the first openings and the second openings should be configured depending on sizes and locations of the source/drain regions formed in subsequent steps, and with consideration of factors such as required stresses and distances between the second openings and the source/drain regions. Besides, the sizes and locations of the second openings 300b greatly influence the amounts of the stresses between the epitaxial layers and the source/drain regions. In an example embodiment, a width of each second opening ranges from about 1 nm to about 20 nm.

In an embodiment, each second opening has a side wall and an included angle between the side wall and the top surface of the substrate 100 ranging from about 63° to about 90°. In other words, a cross-sectional shape of each second opening is an inverted triangle.

In an embodiment, the anisotropic etching process for forming the second openings is a gas etching process with a high thermal budget. In a preferable embodiment, the etching gas is a non-ionized etching gas. Side walls and bottom surfaces of the first openings 300a are etched by thermal motion of the non-ionized gas, and the second openings 300b are formed.

In an embodiment, the etching gas may be a non-ionized gas including chlorine, such as hydrogen chloride or a mixture of hydrogen and chlorine. In another embodiment, the etching gas may be a non-ionized gas including bromine, such as hydrogen bromide.

In an example embodiment, the etching gas is a mixture of hydrogen and chlorine. Specifically, etching parameters in the anisotropic etching process includes: a flow rate of chloride ranging from about 50 sccm to about 300 sccm, a flow rate of hydrogen ranging from about 5 sccm to about 50 sccm, a pressure intensity of a chamber ranging from about 1 torr to about 760 torr, an etching temperature ranging from about 550° C. to 850° C. and an etching time period ranging from about 15 s to about 150 s. Preferably, the flow rate of chloride is about 100 sccm, the flow rate of hydrogen is about 30 sccm, the pressure intensity of the chamber is about 500 torr, the etching temperature is about 800° C. and the etching time period is about 100 s.

In another example embodiment, the etching gas used in the anisotropic etching process is hydrogen bromide. Specifically, etching parameters in the anisotropic etching process includes: a flow rate of hydrogen bromide ranging from about 50 sccm to about 300 sccm, a pressure intensity of a chamber ranging from about 10 torr to about 760 torr, an etching temperature ranging from about 550° C. to about 850° C. and an etching time period ranging from about 15 s to about 150 s. Preferably, the flow rate of hydrogen bromide is about 100 sccm, the pressure intensity of the chamber is about 500 torr, the etching temperature is about 700° C. and the etching time period is about 120 s.

In an embodiment of the present invention, a bottom surface of each first opening includes the crystal plane (100), a side wall of each first opening includes the crystal plane (110), and the side wall of each first opening is perpendicular to the bottom surface of each first opening. In the anisotropic etching process, an etching rate of the bottom surface with the crystal plane (110) is greater than an etching rate of the side wall with the crystal plane (100). Compared with the plasma etching process for forming the first openings, because the thermal motion of the non-ionized etching gas can enhance a horizontal etching effect in the anisotropic etching process, the second openings 300b are formed under and near the first spacers 230.

Besides, the etching gas distributed in the first openings 300a has a concentration gradient when the anisotropic etching process is performed to etch the first openings 300a. The concentration of the etching gas decreases gradually from top to bottom, so that etching rates in different parts of the first openings are different. Specifically, the etching rate of the side wall near to the first spacer 230 is greater than the etching rate of the side wall near the bottom surface of the first opening 300a, so that the cross-sectional shape of each second opening 300b is an inverted triangle.

In light of the above, the second openings 300b are formed by performing an anisotropic etching process to the side walls of the first openings 300a. Because of the anisotropic etching process, the sizes of the first openings 300a in transverse direction are increased, while the sizes of the first openings 300a in longitudinal direction change very little. And because of the concentration gradient of the etching gas distribution, the side walls of the second openings 300b which are near to the first spacers 230 are not perpendicular to the top surface of substrate.

In other embodiments, a repairing etching process may be performed, so that a top width of each second opening 300b is substantially equal to a bottom width of each second opening 300b and the side walls of the second openings 300b which are near to the first spacers 230 are perpendicular to the top surface of the substrate.

In subsequent steps, epitaxial layers will be formed in the first openings 300a and the second openings 300b and source/drain regions will be formed in the epitaxial layers. In the process for forming the epitaxial layers, the second openings are formed underneath the first spacers 230 and closer to the channel regions, and the epitaxial layers are formed by filling the first opening 300a and the second openings 300b, which can increase the stresses between the epitaxial layers and the channel regions. In an embodiment, the epitaxial layers are formed in a PMOS transistor so that compressive stresses between the epitaxial layers and the channel region are enhanced, and the epitaxial layers may include a material selected from SiGe and boron doped SiGe. In other embodiments, if the epitaxial layers are formed in an NMOS transistor, tensile stresses between the epitaxial layers and the channel region will be enhanced, and the epitaxial layers may include a material selected from silicon carbon and phosphorus doped silicon carbon.

It should be noted that, the second openings 300b are formed by etching the side walls of the first openings 300a so that the width of the first spacers 230 is not reduced, which may not affect the protective effect of the first spacers 230 on the devices which need to be protected by the spacers, such as NMOS transistors.

Thereafter, an annealing process is performed to the first openings 300a and the second openings 300b to remove oxide on surfaces of the first openings 300a and the second openings and impurities from a dust-free room such as water and hydrocarbon organism. In an embodiment, parameters in the annealing process include: a flow rate of hydrogen ranging from about 20 sccm to about 50 sccm, an annealing time period ranging from about 60 s to about 120 s, an annealing temperature ranging from about 800° C. to about 850° C. and a pressure intensity of the chamber ranging from about 1 torr to about 700 torr. In an example embodiment, the flow rate of hydrogen is about 20 sccm, the annealing time period is about 80 s, the annealing temperature is about 800° C. and the pressure intensity of the chamber is about 500 torr.

In an embodiment, in order to achieve a good transition from the anisotropic etching process to the annealing process, the etching gas for forming the second openings 300b is a mixture of hydrogen and hydrogen chloride, and hydrogen is used in the annealing process. For the same reason, the pressure intensity of the chamber and the reaction temperature in the annealing process are configured to be close to those in the anisotropic etching process. In an example embodiment, the reaction temperatures in the annealing process and the anisotropic etching process are about 800° C. and the pressure intensities of the chamber in the annealing process and the anisotropic etching process are about 500 torr.

Figure 5:
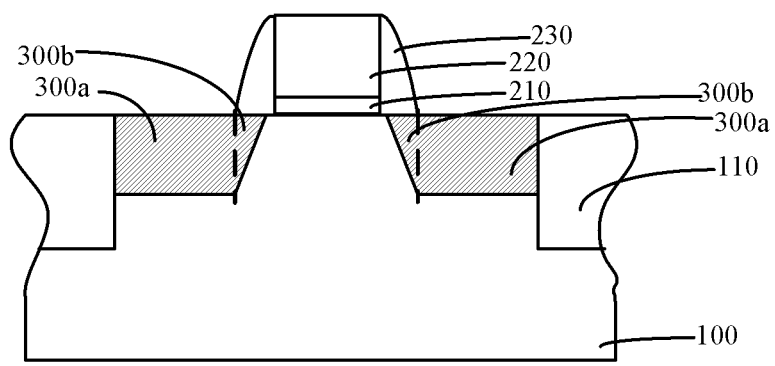

Referring to FIG. 5, an epitaxial growth process is performed for forming the epitaxial layers in the first openings 300a and the second openings 300b. And a width of each epitaxial layer ranges from about 300 Å to about 600 Å. In an example embodiment, the width of each epitaxial layer is about 300 Å.

In an embodiment, in the epitaxial growth process, the pressure intensities of the chamber ranges from about 1 ton to about 20 torr, the reaction temperature ranges from about 550° C. to about 800° C., and the reaction gas at least includes a gas including silicon and a gas including germanium. In an example embodiment, the pressure of the chamber is about 10 torr, and the reaction temperature is about 600° C.

In an embodiment, a flow rate of the reaction gas including silicon ranges from about 30 sccm to about 300 sccm and a flow rate of the reaction gas including germanium ranges from about 5 sccm to about 500 sccm. And the reaction gas including silicon may be silicomethane, disilane dichlorosilane. The reaction gas including germanium may be germane. In an example embodiment, the flow rate of the reaction gas including silicon is about 200 sccm and the flow rate of the reaction gas including germanium is about 300 sccm.

In other embodiments, the reaction gas in the epitaxial growth process may further include hydrogen chloride, hydrogen, or a mixture of hydrogen chloride and hydrogen, a flow rate of hydrogen chloride ranges from about 50 sccm to about 200 sccm, and a flow rate of hydrogen ranges from about 5 sccm to about 50 sccm. In an example embodiment, the flow rate of hydrogen chlorine is about 100 sccm and the flow rate of hydrogen is about 30 sccm.

In the epitaxial growth process, hydrogen chloride is used to ensure a selectivity of the epitaxial growth of the epitaxial layers. Because, in the epitaxial growth of SiGe, SiGe needs be formed only in the first openings and the second openings. To avoid that SiGe is formed in other dielectric layers, hydrogen chloride is used in the epitaxial growth process to enhance uniformity of the epitaxial layers formed.

Figure 6:
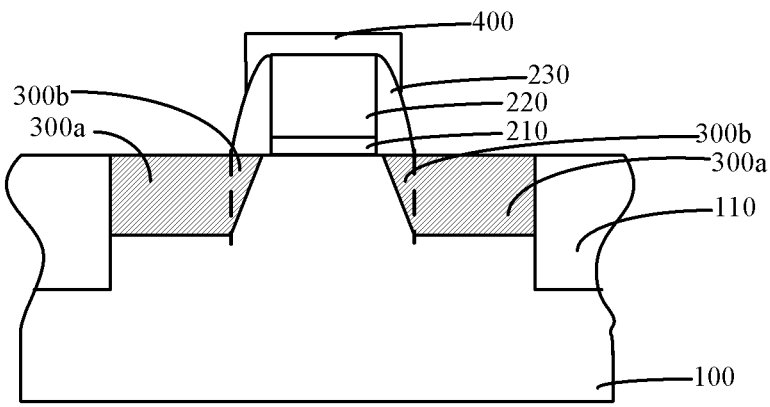
FIG. 6 is a schematic cross-sectional view of an intermediate structure with a sacrificial layer formed on a top of a gate structure in an embodiment of the present invention.

It should be noted that, in the embodiments described above, in the processes for forming the first openings 300a, the second openings 300b and the epitaxial layers, to prevent a top of the gate structure from being damaged and avoid forming epitaxial layers on the top of the gate structure, a sacrificial spacer is formed on the top of the gate structure (not shown in the drawings), which will be described in detail in conjunction with FIG. 6. Referring to FIG. 6, a sacrificial spacer 400 is formed on the top of the gate structure, and the sacrificial spacer 400 is thick enough to protect the gate structure in the processes for forming the first openings 300a, the second openings 300b and the epitaxial layers.

Generally, in a semiconductor device, both offset spacers and outer spacers are formed on both sidewalls of the gate structure, wherein the offset spacers are in contact with the gate structure and the outer spacers are located outside of the offset spacers. Therefore, the second openings may extend to underneath the offset spacers or the outer spacers, in other words, the second openings are located in a part of substrate underneath the offset layers or the outer spacers, which depends on practical factors such as the stresses between the epitaxial layers and the channel region.

The sacrificial layer 400 may be formed by an additional step or formed while forming the gate structure, which will be described in detail as follows.

In an embodiment, the first spacers 230 don't include the offset spacers and the outer spacers, the first spacers 230 and the sacrificial spacer 400 may include a same or different material, and the first spacers 230 and the sacrificial spacer 400 may be formed in different steps. In an example embodiment, in a process for forming the gate structure 220, a film which is used as a hard mask can be retained as the sacrificial spacer 400 and the first spacers 230 are formed in another step. In another example embodiment, after the gate structure 220 is formed, a film is formed on the top of the substrate and the gate structure. Wherein, a portion of the film which covers the top of the gate structure can be used as the sacrificial spacer 400, and a portion of the film on the both sidewalls of the gate structure can be used as the first spacers 230. The first spacers 230 and the sacrificial layer 400 will be removed and the offset spacers and outer spacers will be formed on the both sidewalls of the gate structure in subsequent steps. For example, after forming the epitaxial layer by filling the first openings and the second openings, the first spacers 230 and the sacrificial spacer 400 are removed, and then the offset spacers and outer spacers are formed.

In an alternative embodiment, the first spacers 230 include the offset spacers and protective layers outside the offset spacers. Specifically, firstly the offset spacers are formed on the both sidewalls of the gate structure, and then the protective layers and the sacrificial spacer are formed in a same step. The protective layers and the sacrificial spacer are removed after the epitaxial layers are formed in the first openings and the second openings. Therefore, in the example embodiment, steps for forming the semiconductor device include: forming a gate structure; forming offset spacers on both sidewalls of the gate structure; forming protective layers outside the offset spacers and a sacrificial spacer on the top of the gate structure; forming first openings and second openings; forming epitaxial layers in the first openings and the second openings; removing the sacrificial spacer and the protective layers; and forming outer spacers outside of the offset spacers.

In another alternative embodiment, the first spacers 230 include the offset spacers and outer spacers outside of the offset spacers, and the sacrificial spacer and the outer spacers are formed in a same step. Therefore, after the epitaxial layers are formed, there is no need to remove the outer spacers and only the sacrificial spacer needs to be removed.

In the embodiments, a width of each first spacer 230 is configured selectively depending on different situations. If the first spacers 230 include the offset spacers and the outer spacers, the width of each spacer 230 ranges from about 10 nm to about 25 nm.

As described above, the size and the location of each second opening are configured depending on the required amounts of the stresses between the epitaxial layers and the channel region. If the amounts of the stresses are required to be great, the second openings need be closer to the channel regions, in other words, each of the second openings may extends to underneath the adjacent offset spacer. If the amounts of the stresses are required to be smaller, the second openings may be a little further from the channel regions, in other words, each of the second openings may extends to underneath the adjacent outer spacer.

Moreover, in another embodiment, the method for forming the semiconductor device further includes steps for forming low doped source/drain regions (LDD) and steps for forming source/drain regions. The low doped source/drain regions are formed after forming the offset spacers and before forming the outer spacers, and the source/drain regions are formed after forming the epitaxial layers.

Figure 7:
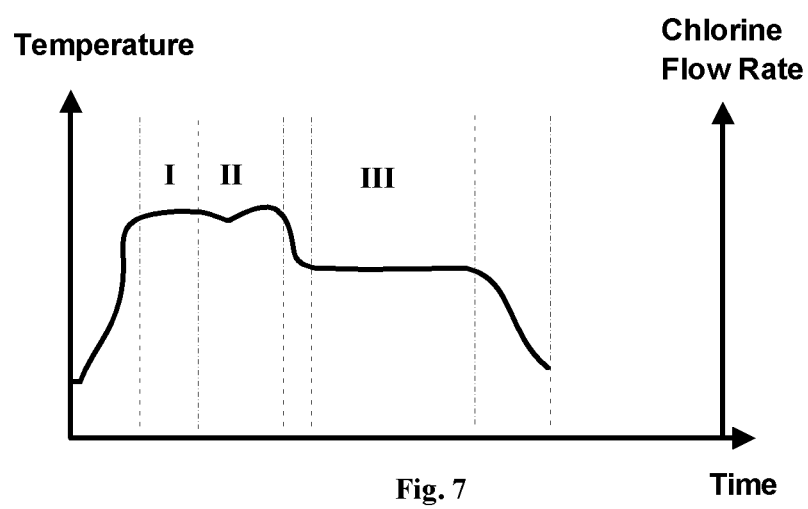
FIG. 7 is a graphic chart illustrating changing trends of temperature in a chamber and a flow rate of an etching gas in three different processes in an embodiment of the present invention.

Besides, in an embodiment, the process for forming the second openings and the process for forming the epitaxial layers in the first openings and the second openings may be performed by different equipments, in other words, the anisotropic etching process and the epitaxial growth process are performed by different equipments. For example, the anisotropic etching process is performed by an etching equipment, and the epitaxial growth process is performed by a molecular beam epitaxy. In an alternative embodiment, the process for forming the second openings and the process for forming the epitaxial layers in the first openings and the second openings may be performed in a same equipment, in other words, the anisotropic etching process and the epitaxial growth process are performed by the same equipment, such as a reduced-pressure chemical vapor deposition epitaxy by controlling process parameters of the equipment. FIG. 7 is a graphic chart illustrating changing trends of temperature of the chamber and the flow rates of the etching gas for forming the second openings and the epitaxial layers. Referring to FIG. 7, three different processes are performed respectively in 3 different phases, which include: phase 1, the second openings are formed and the gas for epitaxial growth is not filled into the chamber; phase 2, the annealing process is performed by using hydrogen; and phase 3, the gas for epitaxial growth is filled into the chamber and the epitaxial growth process is performed. Therefore, the anisotropic etching process and the epitaxial growth process are performed in the same equipment so that process period can be reduced and pollution created when transferring the substrate and additional steps for cleaning the pollution can be avoided. In addition, the annealing process also can be performed in the same equipment where the anisotropic etching process and the epitaxial growth process are performed.

Compared with the prior art, the embodiments of the present invention have the following advantages.

The second openings 300b are formed by etching the first openings 300a with the etching gas. The second openings 300b are expansions of the first openings 300a and located in the substrate underneath the first spacers 230, which can reduce the distances between the epitaxial layers and the channel region and increase the stresses between the epitaxial layers and the channel region, so that the performance of the transistor can be enhanced. Specifically, if the transistor is a PMOS transistor, the compressive stresses between the epitaxial layers and the channel region can be increased, and if the transistor is an NMOS transistor, the tensile stresses between the epitaxial layers and the channel region can be increased.

Moreover, the second openings 300b are formed by etching the side walls of the first openings 300a so that the width of the first spacers 230 is not reduced, which may not affect the protective effect of the first spacers 230 on the devices which need to be protected by the spacers, such as NMOS transistors.

The embodiments of the present invention provide a semiconductor device, including: a substrate having a gate structure and first spacers located on both sidewalls of the gate structure formed on a top surface of the substrate; first openings formed in the substrate and on the both sides of the gate structure; second openings formed in the substrate and under the first spacers, wherein each of the second openings is an expansion of a corresponding one of the first openings; and epitaxial layers formed by filling up the first openings and the second openings.

Referring to FIG. 5, in an embodiment of the present invention, a semiconductor device includes: a substrate 100 having a gate structure including a gate oxide layer 210 and a gate 220 and first spacers 230 on both sidewalls of the gate structure formed on the substrate 100; first openings 300a formed in the substrate 100 and on both sides of the first spacers 230; second openings 300b formed in the substrate 100 and underneath the first spacers 230, wherein each of the second openings 300b is an expansion of a corresponding one of the first openings 300a; and epitaxial layers formed by filling up the first openings and the second openings. In an example embodiment, the width of each first spacer 230 ranges from about 15 nm to about 20 nm. The sizes and locations of the first openings and the second openings should be configured depending on the sizes and the locations of the source/drain regions. In an example embodiment, the width of each second opening ranges from about 1 nm to about 20 nm, each of the second openings includes a side wall and an included angle between the side wall and the top surface of the substrate ranging from about 63° to about 90°. Preferably, the sectional shape of each second opening is an inverted triangle.

The first spacers may include the offset spacers or include the offset spacers and the outer spacers. The second openings may extend to underneath the offset spacers or the outer spacers.

The semiconductor device may further include the epitaxial layers filled in the first openings 300a and the second openings 300b. The epitaxial layers may include a material selected from SiGe, boron doped SiGe, silicon carbon or phosphorus doped silicon carbon. In an example embodiment, the epitaxial layers include SiGe.

It should be noted that, in the embodiments of the present invention, only one transistor is shown in the drawings. However, if a plurality of transistors are provided, second openings of adjacent transistors may be formed in a same step.

Figure 8:
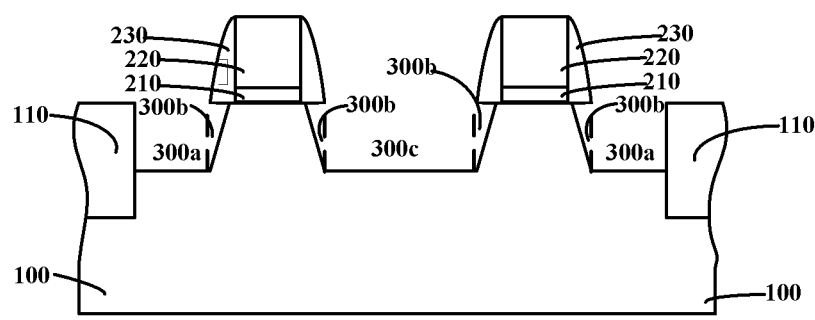
FIG. 8 is a schematic cross-sectional view of an intermediate structure with first openings and second openings formed on two adjacent PMOS transistors in an embodiment of the present invention.

Referring to FIG. 8, two adjacent PMOS transistors share one first opening 300c in the substrate between them. The first opening 300c is formed by using the first spacers of the two adjacent PMOS transistors as masks. Two second openings 300b under each PMOS transistor are formed at both sides of the first opening 300c in a same step.

Although the present invention has been disclosed as above with reference to preferred embodiments, it is not intended to limit the present invention. Those skilled in the art may modify and vary the embodiments without departing from the spirit and scope of the present invention. Accordingly, the scope of the present invention shall be defined in the appended claim.

What is claimed is:

1. A semiconductor device, comprising:
    a substrate;
    a gate structure formed on a top surface of the substrate;
    first spacers formed on both sidewalls of the gate structure;
    first openings formed in the substrate and on the both sides of the gate structure;
    second openings formed in the substrate and under the first spacers, wherein each of the second openings is an extension of a corresponding one of the first openings extended at a sidewall of the corresponding one in a direction toward the gate structure; and
    epitaxial layers formed in the first openings and the second openings, wherein the first openings and the second openings are annealed openings and each of the first openings and the second openings has a size and a location to determine a stress and a distance between the epitaxial layers in the second openings and subsequently-formed source/drain regions.

2. The semiconductor device according to claim 1, wherein a side wall and an included angle between the side wall of the second opening and the top surface of the substrate ranges from about 63° C. to about 90° C.

3. The semiconductor device according to claim 1, wherein each of the first spacers comprises an offset spacer.

4. The semiconductor device according to claim 3, wherein each of the second openings extends to underneath an adjacent offset spacer.

5. The semiconductor device according to claim 1, wherein each of the first spacers comprises an outer spacer.

6. The semiconductor device according to claim 5, wherein each of the second openings extends to underneath an adjacent outer spacer.

7. The semiconductor device according to claim 1, wherein a width of each first spacer ranges from about 15 nm to about 20 nm.

8. The semiconductor device according to claim 1, wherein a width of each second opening ranges from about 1 nm to about 20 nm.

* * * * *